(12) United States Patent
Tseng et al.

(10) Patent No.: US 7,071,758 B2
(45) Date of Patent: Jul. 4, 2006

(54) VOLTAGE LEVEL SHIFTER

(75) Inventors: Ching-Wu Tseng, Sanchong (TW); Alex Tang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 79 days.

(21) Appl. No.: 10/777,599

(22) Filed: Feb. 11, 2004

(65) Prior Publication Data
US 2005/0083100 A1   Apr. 21, 2005

(30) Foreign Application Priority Data
Oct. 21, 2003   (TW)   ................. 92129089 A

(51) Int. Cl.
*H03K 19/096*   (2006.01)
*H03L 5/00*   (2006.01)

(52) U.S. Cl. .................. 327/333; 327/391; 326/68; 326/121

(58) Field of Classification Search ........... 327/112, 327/333, 380, 389, 391, 437; 326/68–71, 326/121
See application file for complete search history.

(56) References Cited

U.S. PATENT DOCUMENTS

| 3,976,984 A * | 8/1976 | Hirasawa ..................... 365/182 |
| 5,039,883 A * | 8/1991 | On ............................... 326/50 |
| 5,751,643 A * | 5/1998 | Lines ..................... 365/189.11 |
| 2005/0195011 A1* | 9/2005 | Tseng et al. ................ 327/333 |

* cited by examiner

*Primary Examiner*—Timothy P. Callahan
*Assistant Examiner*—Terry L. Englund
(74) *Attorney, Agent, or Firm*—J.C. Patents

(57) ABSTRACT

A voltage level shifter is provided. The shifter includes an AND gate for generating a synchronizing signal according to a periodic signal and a primitive input signal. The synchronizing signal and a first periodic control signal that are in phase with the periodic control signal are inputted to a transistor device. The transistor device is constructed with an inverter. The voltage level shifter further includes a buffer for generating an output signal and a capacitor for storing a signal. The present invention also provides a switching circuit for preventing the turning on of both PMOS transistor and NMOS transistor simultaneously during a switching status. The present invention can also solve the issue caused by the ratio of the channel width to the channel length, thus the uncertainty of the manufacturing process will not affect the circuit. Therefore, the power consumption, the chip area and the cost are reduced.

10 Claims, 5 Drawing Sheets

VOLTAGE LEVEL SHIFTER

CROSS-REFERENCE TO RELATED APPLICATION

This application claims the priority benefit of Taiwan application serial no. 92129089, filed on Oct. 21, 2003.

BACKGROUND OF THE INVENTION

1. Field of the Invention

The present invention is generally related to a voltage level shifter. More particularly, the present invention relates to a voltage level shifter suitable for a driving circuit of a liquid crystal display (LCD), wherein the direct current (DC) path thereof may be broken for preventing the turning on of PMOS transistor and NMOS transistors simultaneously. Therefore, the DC power consumption is reduced, and the layout of the circuit and chip area are also reduced.

2. Description of the Related Art

In general, an output stage of a conventional voltage level shifter constructed by metal oxide semiconductors (MOS) includes at least an inverter for buffering. The inverter usually includes a PMOS transistor and a NMOS transistor. The problem generated in the conventional design is that it is hard to control the timing of switching the status between the transistors when the voltage level is changed. It is preferable to minimize the time for turning on both the PMOS transistor and the NMOS transistors during the switching to minimize the power consumption. However, even though the ratio of the channel width to the channel length has been considered carefully and designed, the uncertainty during the manufacturing process will still generate a considerable DC power consumption.

FIG. 4 is a circuit diagram schematically illustrating a conventional voltage level shifter. Referring to FIG. 4, the conventional voltage level shifter includes a differential input for NMOS transistors 411 and 415. The output stage of the voltage level shifter includes a PMOS transistor 403 and a NMOS transistor 413, and the output stage is provided for an inverter 431. The inverter 431 can be, for example, a high voltage inverter. In addition, there is another inverter 433 electrically connected to the transistors 411 and 415. The inverter 433 usually comprises a low voltage inverter because the driving power of the inverter 433 is less than the inverter 431. Moreover, the inverter 433 is provided for converting the input clock transistor-transistor logic (TTL) voltage signal VIN to a differential input. Referring to FIG. 9, when the input is a clock signal and the clock TTL signal is changed from low to high, the inverter 433 inverts the input signal and outputs a signal to a gate of the transistor 411, in which the outputted signal is delayed a little after the VIN. Therefore, there is an extremely short period of time that a gate of the PMOS transistor 405 is at analog high voltage low level GNDA when the NMOS transistor 415 is turned on and the NMOS transistor 411 is not turned off. Thus, when the PMOS transistor 405 is still on, the PMOS transistor 405 and the NMOS transistor 415 are turned on at the same time. Thus, as shown in FIG. 9, current I(415) has a surge at the beginning of each input cycle. Moreover, for generating the differential input signal pair, the PMOS transistor requires a very fast switching in order that the NMOS transistor can control the gate of the PMOS transistor within a short time. Thus, the ratio of the channel width to the channel length of the transistors is designed to achieve the desired effects described above. Typically, the NMOS transistor is designed to have a smaller impedance, i.e., with a channel having a wider width and a shorter length, and the PMOS transistor is designed to have a larger impedance, i.e., with a channel having a narrower width and a longer length.

Similarly, referring to FIG. 4 and FIG. 9, when the input clock signal is changed from high to low, the NMOS transistor 415 is turned off. At this moment, the gate of the NMOS transistor 411 is not turned on due to a time delay, therefore, the transistor 411 is at a high impedance state. During this time, a gate of the PMOS transistor 401 is at low voltage level, thus the PMOS transistor 401 is still on. Therefore, another conducting path is generated by the PMOS transistor 401 when the NMOS transistor 411 is changed from low to high level, and a current I(411) will generate a surge at this time.

Thus, the breaking of the conducting path between the high voltage and the ground is required in order to reduce the power consumption during the turning on of both of the PMOS transistor and NMOS transistors to reduce the power consumption of the analog circuit.

Furthermore, the voltage level shifter that applies to a driving circuit of a LCD occupies significant chip area. The chip area can be more compact if the ratio of the channel width to the channel length is not an issue. Therefore, a voltage level shifter that can reduce the power consumption and the chip area to lower down the cost is required.

SUMMARY OF THE INVENTION

The present invention is to provide a voltage level shifter wherein the current path between the high voltage level and the ground are completely broken.

Another objective of the present invention is to provide a voltage level shifter wherein the ratio of the channel width to the channel length of the transistors is not a major issue in the circuit design.

Another objective of the present invention is to provide a voltage level shifter suitable for a driving circuit of a LCD, wherein the chip area is substantially reduced due to the repeating of some circuits.

The present invention provides at least one voltage level shifter for breaking the current path and for turning on the PMOS transistor and NMOS transistors connected in serial in the circuit at different times. Thus, an input/output control sequence is required. The present invention provides many different input/output timing sequences in the embodiments that can achieve the desired results. This invention may, however, be embodied in many other different forms and should not be construed as limited to the embodiments set forth herein. These embodiments are provided so that this disclosure will be thorough and complete, To begin with, an output stage of a voltage level shifter is an inverter. When an input signal of the shifter is at low voltage level, an output signal from the output stage is also at low voltage level. A PMOS transistor should have been turned off before a NMOS transistor is turned on when the input signal is changed from low level to high level. Thus, a control signal is provided with a time period in front of the input signal. The input signal and the control signal are processed by an inverter, thus the PMOS transistor is at a high impedance during the rising of the control signal and the rising of the input signal. During this time, the output stage outputs a low voltage signal and a capacitor stores the original high voltage level of the output stage. The NMOS transistor is turned on when the input signal is changed from low to high level. The NMOS transistor pulls down the voltage stored in the capacitor to low voltage level. At the same time, an inverter pulls up an output terminal to high voltage level.

Similarly, the NMOS transistor should have been turned off before the PMOS transistor turns on when the input signal changes from high to low level. In other words, the NMOS transistor should also be at high impedance state for another time period before the PMOS transistor is turned on. The capacitor is maintained at the ground level and then the PMOS transistor is turned on, thus a high voltage level is achieved within a short time. During this time, the output stage outputs a low voltage signal. Therefore, the control signal has a direct impact on the operation of the circuit.

However, the PMOS transistor is turned on when the control signal is periodic and the input signal is at high voltage level. The capacitor is charged up from the ground to high voltage level within a short period of time, and thus an error output is generated. Thus, a switch transistor is connected in between the NMOS transistor and the capacitor for producing another control signal to break the charging path. As a result, the voltage level of the capacitor is maintained. The capacitor keeps to perform the same operation as previously described when the control signal changes back to low voltage level again.

As a simplified version of the present invention, an AND gate of the input terminal, the PMOS transistor and the NMOS transistor can be three transistors connected in series. The sequence of the connection from high voltage level to the ground includes a first PMOS transistor, a first NMOS transistor and a second NMOS transistor. Wherein, a gate of the second NMOS transistor is electrically connected to the input signal. A gate of the first PMOS transistor and a gate of the first NMOS transistor are electrically connected to a first control signal. Moreover, the transistor in a buffer (for example, an inverter described above) has to be in a proper size in order to drive the next output. Moreover, the capacitor, for example, can be comprised of a second PMOS transistor and a third PMOS transistor connected in series. Wherein, the second PMOS transistor is electrically connected to a high voltage level and a gate of the second PMOS transistor is electrically connected to a second control signal. The third PMOS transistor is electrically connected to the buffer (for example, an inverter), and thus a latch circuit is provided. Furthermore, the switch transistor, for example, can be comprised of a third NMOS transistor. The PMOS transistors can be designed in any size, for example, be high voltage transistors. Thus, the uncertainty generated from the manufacturing process is reduced and the stability of the circuit is enhanced.

The first control signal produces a negative pulse with very narrow width when the inputted clock signal changes from low to high voltage level. During this time, the second NMOS transistor is turned on and the first control signal changes to low voltage level. As a result, the first and third NMOS transistors are turned off, the first PMOS transistor is turned on and the capacitor keeps the same voltage level. At the same time, the second control signal inputs a positive pulse with a wider pulse width than the pulse width of the first control signal. During this time, the second PMOS transistor is turned off. Thus, a high impedance path is formed between the second and third PMOS transistors. Moreover, the first and third NMOS transistors are turned on and the first PMOS transistor is turned off when the negative pulse from the first control signal ends. At the same time, the capacitor discharges to low voltage level and the output signal changes to high voltage level. The third PMOS transistor turns off due to high voltage level in the output.

Although the second PMOS transistor conducts when the positive pulse of the second control signal is off, but because the third PMOS transistor remains in the off state, a high impedance path is formed between the second and third PMOS transistors and the capacitor maintains the low voltage level.

In the case when the input clock signal is at high voltage level and the first control signal and the second control signal provide a negative pulse and a positive pulse respectively, the first PMOS transistor is turned on. During this time, the first and third NMOS transistors are turned off and the voltage level of the capacitor remains the same as previous.

Similarly, the first control signal produces a negative pulse with very narrow width when input a clock signal that changes from high to low voltage level. During this time, the second NMOS transistor turns on and the first control signal changes to low voltage level. As a result, the first and third NMOS transistors are turned off, the first PMOS transistor is turned on and the capacitor maintains the same voltage level. Moreover, the first and third NMOS transistors are turned on and the first PMOS transistor is turned off when the negative pulse from the first control signal ends. The second NMOS transistor is turned off because the original input signal is at low voltage level. Hence, the second PMOS transistor temporarily acts as a parasitic capacitor before the positive pulse from the second control signal ends. During this time, the second PMOS transistor is at high impedance state and the output signal is at low voltage level. The second PMOS transistor conducts after the positive pulse from the second control signal ends. Thus, the second and third PMOS transistors form a conducting path. At this time, the capacitor is at high voltage level.

Similarly, in the case when the input clock signal is at low voltage level and the first control signal and the second control signal provide a negative pulse and a positive pulse respectively, the first PMOS transistor is turned on. During this time, the first and third NMOS transistors are turned off and the voltage level of the capacitor remains the same as previous. Immediately after that, the third PMOS transistor temporarily (with high impedance) acts as a parasitic capacitor for a short period of time (Td).

Moreover, both of the first and second control signals (for example, high voltage control signals) use positive/negative pulses as the controlling signals to control a voltage level shifter. The first control signal and second control signal provide a negative pulse and a positive pulse respectively when the input status is changed. The width of a negative pulse should be slightly wider than the width of a positive pulse because the time periods between the positive pulse and the negative pulse inevitably results in high impedance. The slightly wider negative pulse also prevents damages resulted from the second and third PMOS transistors being conducted to the first, second and third NMOS transistors when the input signal is at high voltage level.

Moreover, the first PMOS transistor, the first and third NMOS transistors form conducting paths when the input signal is changed to a high voltage level. Furthermore, the first PMOS transistor and the first NMOS transistor produce smaller surges compared to that of the prior art since the first PMOS transistor/NMOS transistor can be designed in many ways.

Similarly, the buffer of the output stage (the buffer comprises an inverter made from PMOS transistor/NMOS transistor) also results in a smaller surge (compared to prior art) when the input clock signal is changed from high to low voltage level.

Accordingly, in the voltage level shifter of the present invention, two control signals are provided to turn on and off the PMOS transistor and NMOS transistors, thus the power consumption during the turning on of the PMOS transistor and NMOS transistors is reduced. Moreover, the current path between the high voltage level and the ground are also broken totally by the two control signals reducing the power consumption of the analog circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
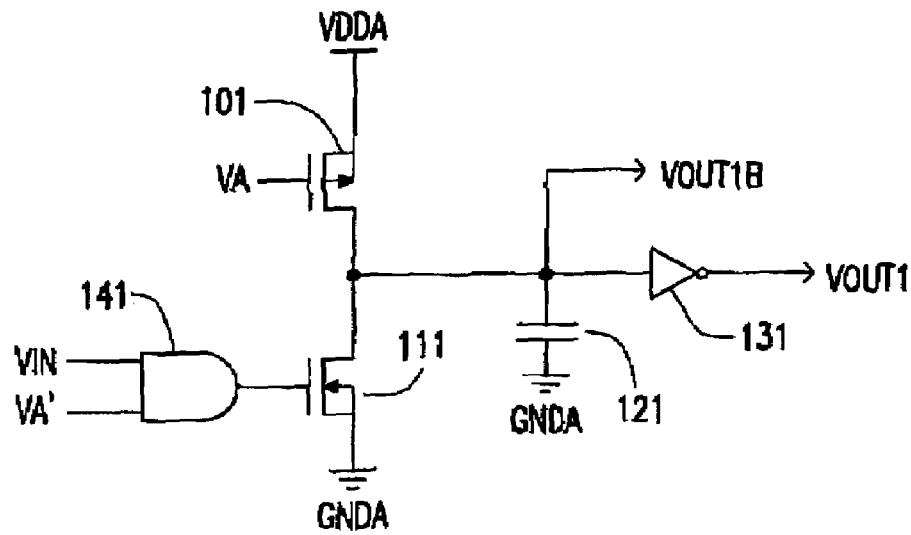
FIG. 1 is a circuit diagram schematically illustrating a voltage level shifter according to one preferred embodiment of the present invention.
Figure 5:
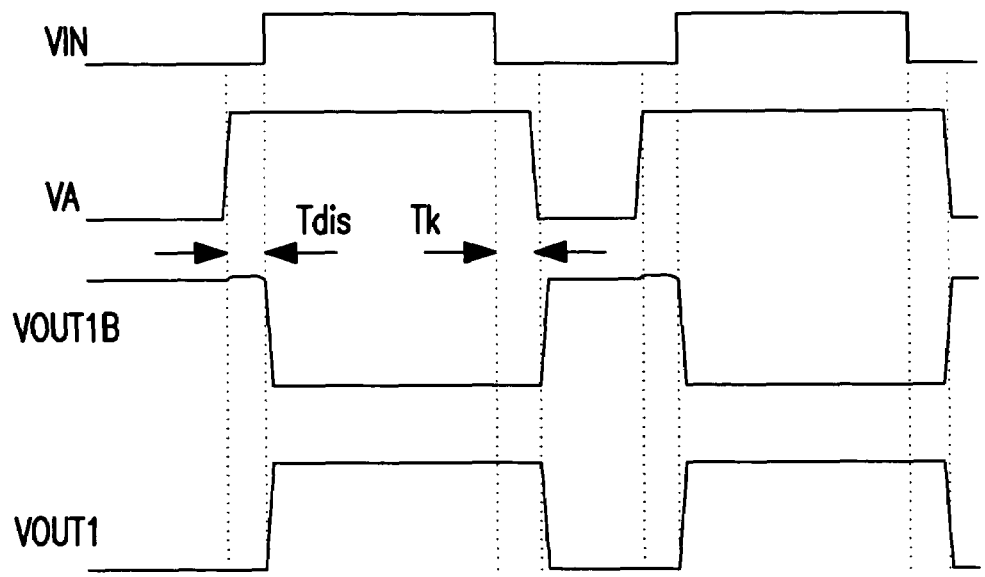
FIG. 5 is a waveform diagram schematically illustrating the simplified input and output voltages of the voltage level shifter of FIG. 1.

FIG. 1 is a circuit diagram schematically illustrating a voltage level shifter according to one preferred embodiment of the present invention. Referring to FIG. 1, an inverter includes, for example but not limited to, a PMOS transistor 101 and a NMOS transistor 111. The output stage is provided by an inverter 131. The inverter 131 can be, for example, a high voltage inverter. A first control signal (VA') inputted to the AND gate 141 comprises, for example, a low voltage signal, and a second control signal (VA) inputted to the transistor 101 is adjusted to comprise a high voltage signal having the same phase as the first control signal (VA') inputted to the AND gate. The PMOS transistor 101 and the NMOS transistor 111 need to be activated at different times in order to break the current paths. FIG. 5 is a waveform diagram schematically illustrating the simplified input and output voltages of the voltage level shifter of FIG. 1. Referring to FIG. 5, the transistor 101 should be turned off before the transistor 111 is turned on when an input VIN (e.g., a clock TTL voltage signal) changes from low to high level. Thus, a control signal VA is input to the voltage level shifter, —in which a timing of the control signal VA is prior to the input VIN by a time period Tdis. The control signal VA, for example, can be a high voltage control signal. The state of VOUT1B prior to the Tdis is at an analog high voltage high level VDDA, and the state of VOUT1B during the period Tdis is at high impedance state. Thus, a capacitor 121 stores the original high level and an output stage of the voltage level shifter maintains its outputs to VOUT1 with an analog high voltage low level GNDA. The transistor 111 is turned on when VIN is at high level, thus the VOUT1B is pulled down to the analog high voltage low level GNDA and then the output stage outputs to VOUT1 with an analog high voltage high level VDDA.

Similarly, the transistor 111 should be turned off before the transistor 101 is turned on when VIN changes from high to low level. The transistor 111 remains at a high impedance state at a time period Tk before the transistor 101 is turned on. Likewise, the capacitor 121 stores the ground level of VOUT1B. Thus, VOUT1B charges up to VDDA within a short period of time when the transistor 101 is turned on, and the output stage outputs an analog high voltage low level GNDA. Therefore, the control signal VA has a direct impact on the circuit's operation.

Figure 6:
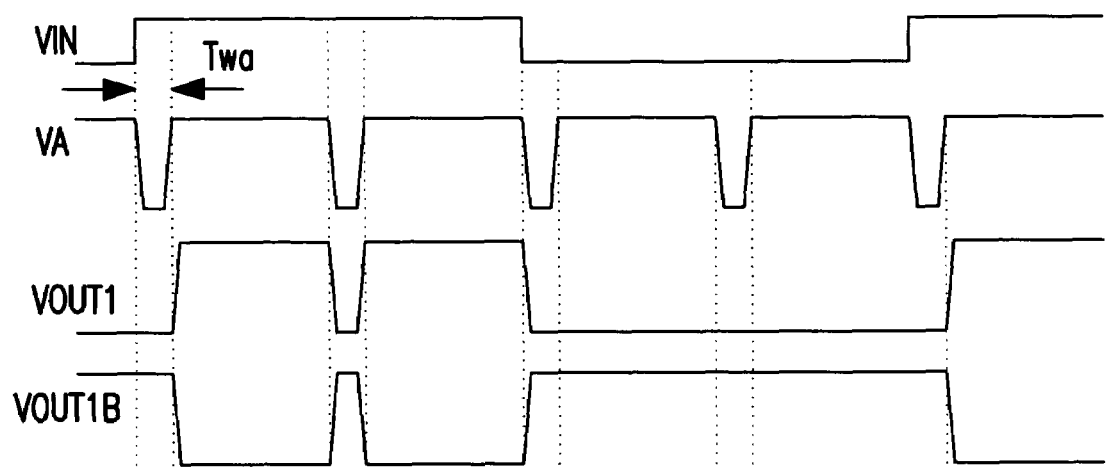
FIG. 6 is a waveform diagram schematically illustrating the input and output voltages of the voltage level shifter of FIG. 1.

FIG. 6 is a waveform diagram schematically illustrating the input and output voltages of the voltage level shifter of FIG. 1. Referring to FIG. 1 and FIG. 6, the PMOS transistor 101 is turned on when the control signal VA is periodically inputted and the input TTL voltage level (VIN) is at high level. At this moment, VOUT1B is charged up from the analog high voltage low level GNDA to VDDA rapidly, and a wrong output is generated.

Figure 2:
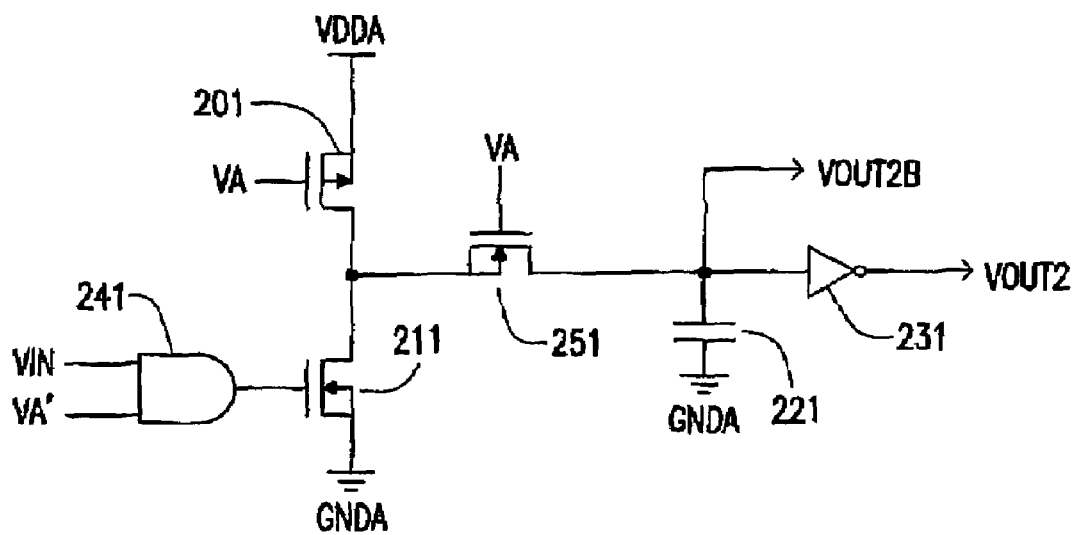
FIG. 2 is a circuit diagram schematically illustrating a voltage level shifter according to another preferred embodiment of the present invention.
Figure 7:
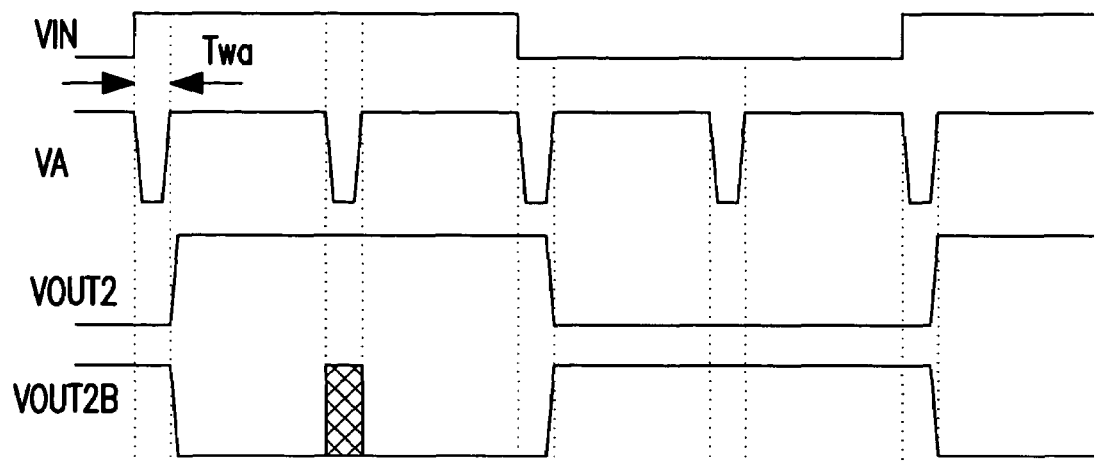
FIG. 7 is a waveform diagram schematically illustrating the input and output voltages of the voltage level shifter of FIG. 2.

FIG. 2 is a circuit diagram schematically illustrating a voltage level shifter according to another preferred embodiment of the present invention. Referring to FIG. 2, a NMOS transistor switch transistor 251 controlled by the control signal is provided for breaking the charging path. As a result, the voltage level of VOUT2B is maintained by the capacitor 221. FIG. 7 is a waveform diagram: schematically illustrating the input and output voltages of the voltage level shifter of FIG. 2. Referring to FIG. 7, the voltage level of VOUT2B is maintained by the capacitor 221 when VA is changed to low voltage level.

Figure 3:
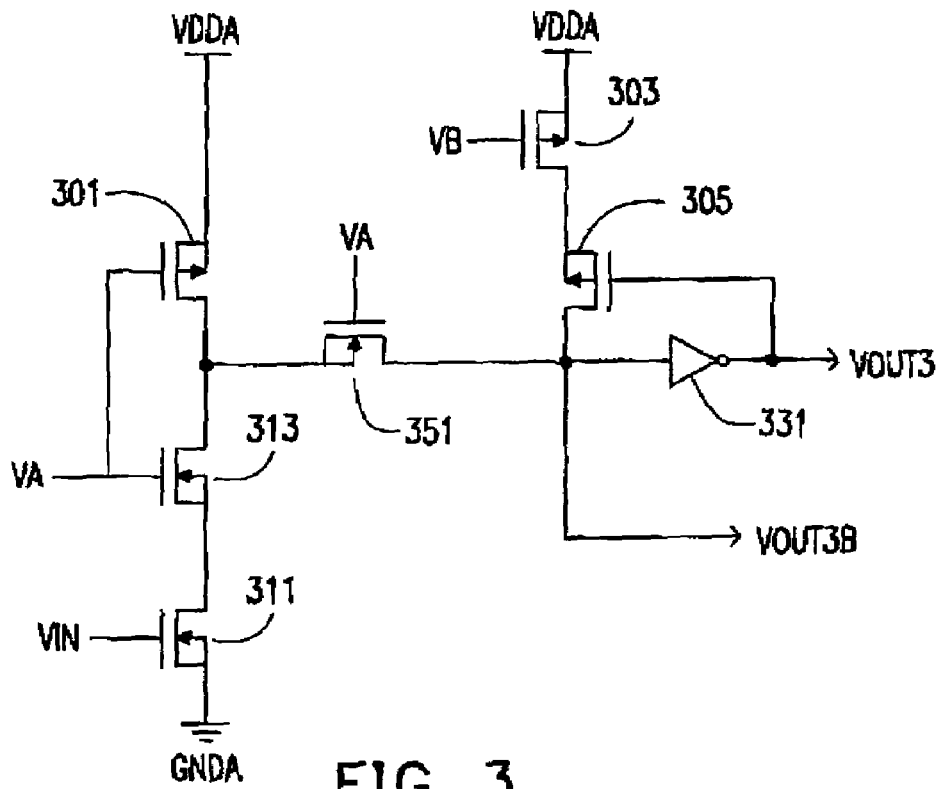
FIG. 3 is a circuit diagram schematically illustrating a voltage level shifter according to yet another preferred embodiment of the present invention.
Figure 4:
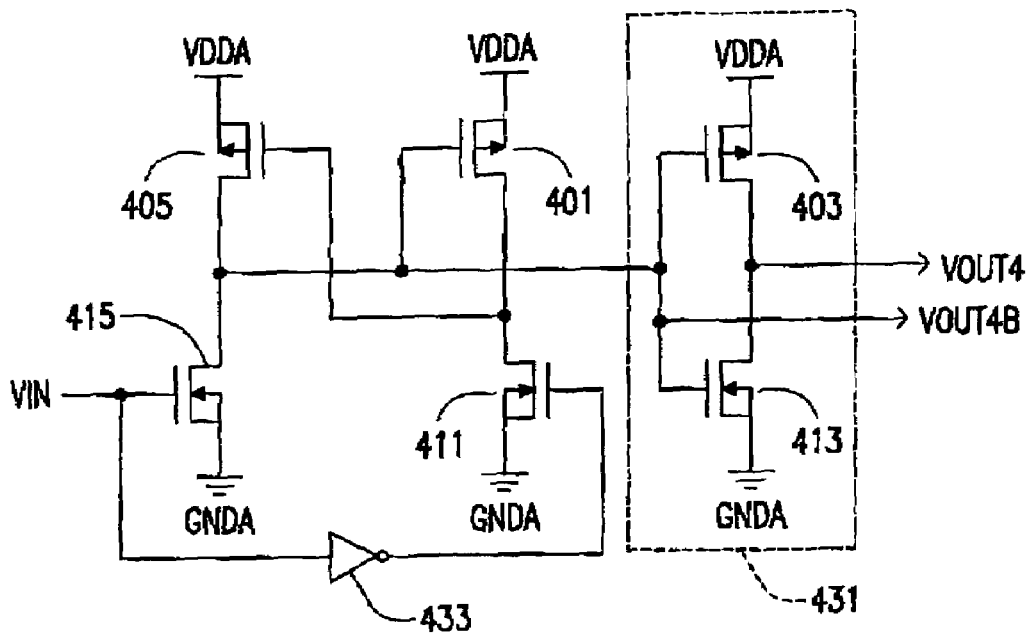
FIG. 4 is a circuit diagram schematically illustrating a conventional voltage level shifter.

FIG. 3 is a circuit diagram schematically illustrating a voltage level shifter according to yet another preferred embodiment of the present invention. In this embodiment of the present invention, only the buffer has to be designed in a proper size (for driving the next output), other MOS transistors can be designed in any sizes for buffering the output and maintaining the signal (as the capacitor 221 shown in FIG. 2). The PMOS transistor can be a field effect transistor (FET) designed in any size, for example, as a high voltage FET, thus the uncertainty in the manufacturing process is reduced and the stability of the circuit is enhanced.

Figure 8:
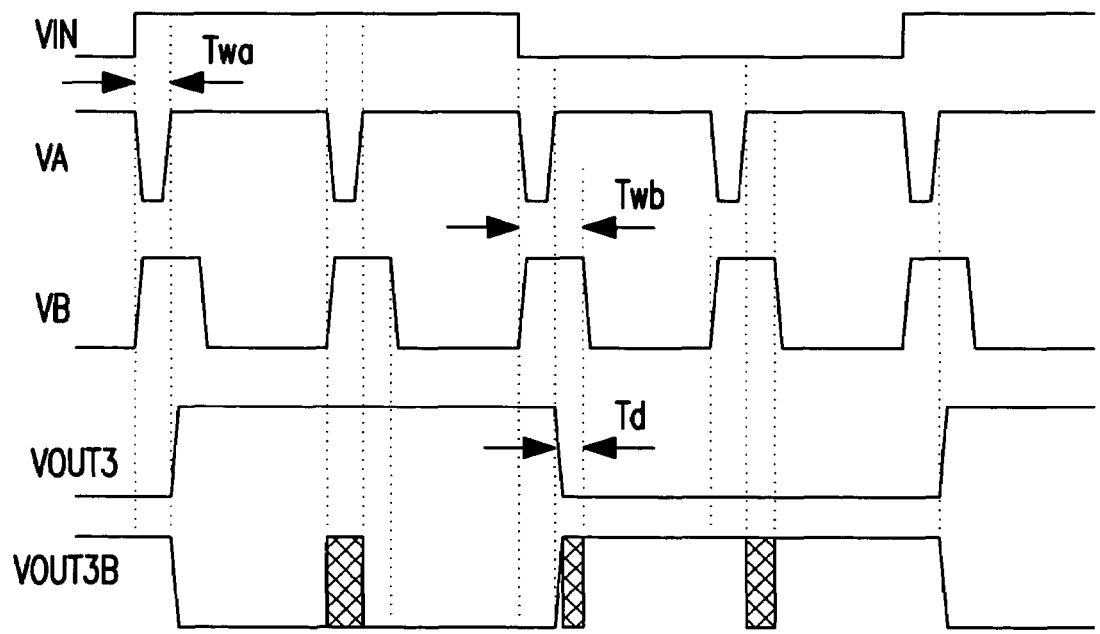
FIG. 8 is a waveform diagram schematically illustrating the input and output voltages of the voltage level shifter of FIG. 3.

FIG. 8 is a waveform diagram schematically illustrating the input and output voltages of the voltage level shifter of FIG. 3. Referring to FIG. 3 and FIG. 8, the control signal VA produces a delayed negative pulse with very narrow width Twa when a clock TTL voltage signal changes from low to high level. During this period Twa, a NMOS transistor 311 is on, and since VA is pulled down to low level, the NMOS transistor 313 and the switch transistor 351 are turned off rapidly. In addition, the PMOS transistor 301 is turned on and VOUT3B maintains the voltage level. On the other hand, another control signal VB produces a positive pulse with a pulse width of Twb (Twb is wider than Twa) during the time period Twa. During this time period Twb, PMOS transistor 303 is off, therefore a high impedance path is constructed by the PMOS transistors 303 and 305. The NMOS transistor 313 and the switch transistor 351 are turned on again when the negative pulse of VA is off. Thus, the PMOS transistor 301 is turned off, VOUT3B is pulled down to analog high voltage low level GNDA, and the state of VOUTB3 is changed to high voltage high level VDDA. Thus, the PMOS transistor 305 is turned off since VOUT3 is at high voltage high level VDDA. Moreover, the PMOS transistor 303 is turned on since the PMOS transistor 305 is turned off when the positive pulse of VB is off. Similarly, a high impedance path is constructed by the PMOS transistors 303 and 305, and during this moment, VOUT3B remains at analog high voltage low level GNDA.

Referring to FIG. 8, the PMOS transistor 301 turns on when the clock TTL voltage signal remains at high level and, the control signals VA and VB provide a negative pulse and a positive pulse respectively. During this moment, the NMOS transistor 313 and the switch transistor 351 turn off and VOUT3B remains at the same voltage level.

Similarly, the control signal VA produces a delayed negative pulse with very narrow width Twa when a clock TTL voltage signal changes from high to low level. During this moment, the NMOS transistor 313 and the switch transistor 351 are turned off rapidly, the PMOS transistor 301 is turned on and VOUT3B remains at analog high voltage low level GNDA. The NMOS transistor 313 and the switch transistor 351 are turned on when the negative pulse of VA is off. During this time, the PMOS transistor 301 is turned off. In addition, since the VIN is at low voltage level originally so the NMOS transistor 311 is turned off. Therefore, during a time period Td (Td=Twb−Twa), the PMOS transistor 305 is at high impedance state before the positive pulse of VB is off. The PMOS transistor 305 is provided as a junction capacitor (i.e., a parasitic capacitor) as capacitor 221 shown in FIG. 2. Thus, VOUT3 is at analog high voltage low level GNDA. The PMOS transistor 303 is turned on rapidly after the positive pulse of VB is off. Thus a conducting path is constructed by the PMOS transistors 303 and 305, and VOUT3B is at high voltage high level VDDA via the conducting path.

Moreover, the NMOS transistor 313 and the switch transistor 351 are turned off when a clock TTL voltage signal remains at low level and when the control signals VA and VB provide a negative pulse and a positive pulse respectively. FIG. 8 shows input and output voltage level changes of the voltage level shifter. Referring to FIG. 8, VOUT3B remains at an analog high voltage high level VDDA during this moment. Similarly, during a time period Td (Td=Twb−Twa), the PMOS transistor 305 is at high impedance state, thus the PMOS transistor 305 is provided as a junction capacitor (i.e., a parasitic capacitor) for maintaining the analog high voltage high level VDDA.

As one preferred embodiment of the present invention, the two control signals VA and VB, for example, use positive and negative pulses as the controlling signals for a voltage level shifter. The control signals VA and VB are periodic signals. A negative pulse of VA and a positive pulse of VB are provided when the input TTL voltage signal VIN changes the state, wherein a width Twa of the negative pulse of VA corresponding to a delay after the rising of VIN. Thus, a narrower pulse width Twa is desired. Furthermore, a width Twb of the positive pulse of VB should be slightly wider than Twa because the time period Td will causes a high impedance state. The slightly wider negative pulse also can prevent from the conducting path constructed by the turning on of the PMOS transistors 303, 305 and the NMOS transistors 311, 313 and 351 when the input signal VIN is at high voltage level.

Figure 9:
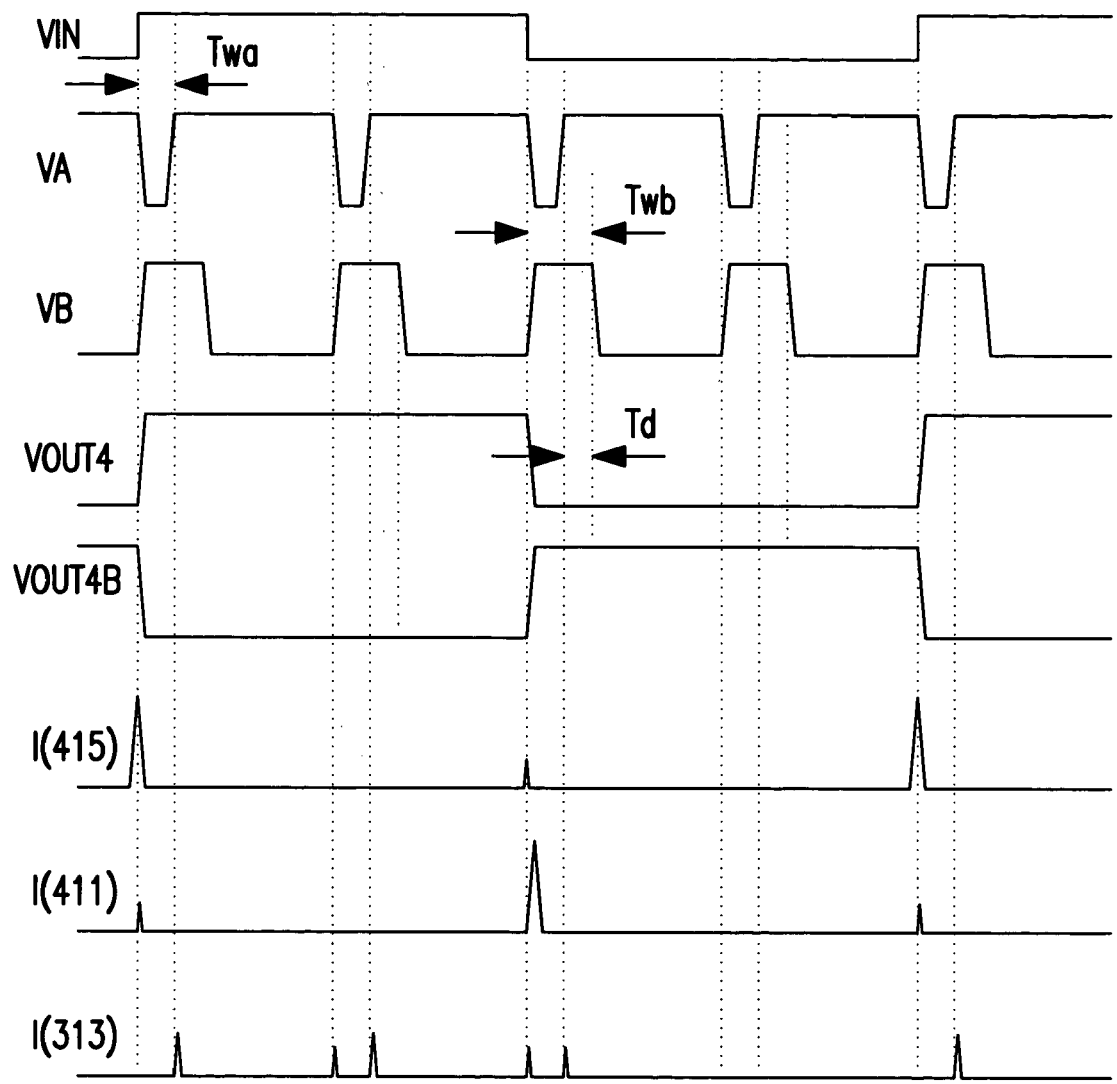
FIG. 9 is a waveform diagram schematically illustrating the relationships between the input voltages and currents of the transistors of a conventional voltage level shifter and a voltage level shifter according to one preferred embodiment of the present invention.

As another preferred embodiment of the present invention, the possible conducting paths, for example, can be constructed by the PMOS transistor 301, the NMOS transistor 313 and the switch transistor 351 during the changing of state thereof when VIN changes to high voltage level. Referring to FIG. 9, the surge of current I(313) is much smaller than the surge of current I(415) because the PMOS transistor 301 and the NMOS transistor 313 are designed to be of any size.

FIG. 9 is a waveform diagram schematically illustrating the relationships between the input voltages and currents of the transistors of a conventional voltage level shifter and a voltage level shifter according to one preferred embodiment of the present invention. Similarly, referring to FIG. 9, as another preferred embodiment of the present invention, a smaller surge is generated in compared with a conventional voltage level shifter since the inverter is constructed by PMOS transistor and NMOS transistors and the time period during the negative rising edge of the input signal.

Accordingly, two control signals are provided to turn on and off the PMOS transistor and NMOS transistors in the voltage level shifter of the present invention, thus the power consumption during the turning on of the PMOS transistor and NMOS transistors is reduced. Moreover, the current path between the high voltage level and the ground are also broken totally by the two control signals to reduce the power consumption of the analog circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage level shifter, comprising:
   an AND gate for processing a first control signal and an input signal to produce a synchronizing signal, wherein the first control signal is a periodic signal;
   a transistor device having a first transistor and a second transistor, wherein a drain of the first transistor and a drain of the second transistor are electrically connected at a first contact point, a source of the first transistor then is electrically connected to a ground and a source of the second transistor is electrically connected to a voltage source, a gate of the first transistor is electrically connected to the synchronizing signal and a gate of the second transistor is electrically connected to a second control signal having the same phase as the first control signal;

a switch, controlled by the second control signal, wherein one terminal of the switch is electrically connected to the first contact point and the other terminal of the switch is electrically connected to a second contact point;

a buffer for producing an output signal, wherein an input terminal of the buffer is connected to the second contact point; and a capacitor, wherein one terminal of the capacitor is electrically connected to the second contact point for storing a signal level of the second contact point, and the other terminal of the capacitor is electrically connected to the ground.

2. The voltage level shifter of claim 1, wherein the switch comprises an n-type metal oxide semiconductor.

3. The voltage level shifter of claim 1, wherein the buffer comprises an inverter having at least a PMOS transistor and a NMOS transistor.

4. The voltage level shifter of claim 1, wherein the capacitor comprises a transistor provided as a parasitic capacitor.

5. The voltage level shifter of claim 1, wherein the AND gate comprises a low voltage transistor device, and the transistor device, the buffer and the capacitor comprise high voltage transistor devices.

6. A voltage level shifter, comprising:
   a switch;
   an input transistor device comprises:
      a first transistor, electrically connected to a voltage source;
      a second transistor; and
      a third transistor, electrically connected to a ground;
      wherein the first transistor is a PMOS transistor, the second and third transistors are NMOS transistors, a gate of the first transistor and a gate of the second transistor are electrically connected to a first control signal, a gate of the third transistor is electrically connected to an input signal, a drain of the first transistor and a drain of the second transistor are electrically connected at a first contact point, and a source of the third transistor is electrically connected to the ground and a drain of the third transistor is electrically connected to a source of the second transistor;
   wherein the switch is controlled by the first control signal, in which one terminal of the switch is electrically connected to the first contact point;
   a capacitor, electrically connected to another terminal of the switch at a second contact point for storing a signal level of the second contact point; and
   a buffer for producing an output signal, wherein the input terminal of the buffer is electrically connected to the second contact point.

7. The voltage level shifter of claim 6, wherein the capacitor comprises a transistor provided as parasitic capacitor.

8. The voltage level shifter of claim 6, further comprising:
   a fourth transistor;
   a fifth transistor; and
   a second control signal;
   wherein the capacitor is electrically connected to the fourth transistor, in which a drain, a gate and a source of the fourth transistor are electrically connected to the second contact point, an output terminal of the buffer and the fifth transistor respectively, a gate of the fifth transistor is electrically connected to the second control signal, and the fourth and the fifth transistors are PMOS transistors.

9. The voltage level shifter of claim 8, wherein the first control signal is a periodic negative pulse and the second control signal is a periodic positive pulse, the first and the second control signals are synchronized and a width of the negative pulse is narrower than a width of the positive pulse.

10. The voltage level shifter of claim 8, wherein the first, second, third, fourth and fifth transistors and the buffer comprise high voltage field effect transistor devices.

* * * * *